(12) United States Patent
Hung et al.

(10) Patent No.: US 9,904,176 B2
(45) Date of Patent: Feb. 27, 2018

(54) INTERFERENCE LITHOGRAPHY DEVICE (71) Applicants: National Sun Yat-sen University, Kaohsiung (TW); LandMark Optoelectronics Corporation, Tainan (TW)

(72) Inventors: Yung-Jr Hung, Kaohsiung (TW); Wei Lin, Tainan (TW)

(73) Assignees: NATIONAL SUN YAT-SEN UNVIERSITY, Kaohsiung (TW); LANDMARK OPTOELECTRONICS CORPORATION, Tainan (TW)

( * ) Notice: Subject to any disclaimer, the term of this patent is extended or adjusted under 35 U.S.C. 154(b) by 0 days.

(21) Appl. No.: 15/145,816

(22) Filed: May 4, 2016

(65) Prior Publication Data

US 2017/0123325 A1 May 4, 2017

(30) Foreign Application Priority Data

Nov. 3, 2015 (TW) .............................. 104136195 A (51) Int. Cl.
| | |
|---|---|
| *G03B 27/52* | (2006.01) |
| *G03F 7/20* | (2006.01) |
| *G02B 26/08* | (2006.01) |
| *G02B 27/10* | (2006.01) |
| *G02B 27/28* | (2006.01) |

(52) U.S. Cl.
CPC ..... *G03F 7/70191* (2013.01); *G02B 26/0816* (2013.01); *G02B 27/106* (2013.01); *G02B 27/286* (2013.01); *G03F 7/70408* (2013.01)

(58) Field of Classification Search
CPC  G02B 26/0816; G02B 27/106; G02B 27/286; G03F 7/70191
See application file for complete search history.

(56) References Cited

U.S. PATENT DOCUMENTS

| | | | | |
|---|---|---|---|---|
| 4,792,197 A | * | 12/1988 | Inoue .................... | G02B 5/1857 359/15 |
| 6,304,318 B1 | * | 10/2001 | Matsumoto ......... | G03F 7/70408 355/53 |
| 6,709,790 B1 | * | 3/2004 | Gratrix ............... | G02B 5/1857 359/1 |
| 6,882,477 B1 | | 4/2005 | Schattenburg et al. | |
| 7,969,580 B2 | * | 6/2011 | Yen ........................ | G03B 27/42 356/500 |
| 8,681,315 B2 | | 3/2014 | Mao et al. | |

(Continued)

OTHER PUBLICATIONS

Mirror-tunable Laser Interference Lithography System for Wafer-scale Patterning with Flexible Periodicity.

*Primary Examiner* — Deoram Persaud
(74) *Attorney, Agent, or Firm* — Mark M. Friedman (57) ABSTRACT

An interference lithography device is provided with a laser source for providing a laser beam; a base thereon having a beam splitter for dividing the laser beam into a first beam portion and a second beam portion, a beam expander, a first set of reflectors, and a second set of reflectors; a set of lower reflectors; and a sample carrying stage for holding a substrate. The first beam portion and the second beam portion are respectively reflected from the second set of reflectors and then respectively reflected by the set of lower reflectors to form an interference pattern on the substrate.

10 Claims, 6 Drawing Sheets

(56) References Cited

U.S. PATENT DOCUMENTS

| | | | |
|---|---|---|---|
| 2006/0066873 A1* | 3/2006 | Hill | G01J 1/58 |
| | | | 356/511 |
| 2007/0279642 A1 | 12/2007 | Shmarev | |
| 2010/0284015 A1* | 11/2010 | Sewell | G03F 7/70408 |
| | | | 356/450 |
| 2011/0019175 A1* | 1/2011 | Fu | G03B 27/58 |
| | | | 355/74 |
| 2013/0017498 A1 | 1/2013 | Mao et al. | |
| 2013/0153553 A1* | 6/2013 | Lasagni | B23K 26/0084 |
| | | | 219/121.69 |

* cited by examiner

INTERFERENCE LITHOGRAPHY DEVICE

CROSS REFERENCE TO RELATED APPLICATIONS

This application claims the benefit of priority of Taiwan Patent Application No. 104136195, filed on Nov. 3, 2015, the disclosure of which is incorporated herein by reference. This invention is partly disclosed in a thesis entitled "Mirror-tunable Laser Interference Lithography System for Wafer-scale Patterning with Flexible Periodicity" on May 4, 2015 completed by Vu-Nung Lin, Yung-Jr Hung, Chia-Wei Huang, and Ping-Chien Chang.

FIELD OF THE INVENTION

The present invention relates to an interference lithography device, and in particular relates to a laser interference lithography device having large exposure area and adjustable periodicity.

BACKGROUND OF THE INVENTION

Laser interference lithography technology is a low-cost manufacturing technique to produce a periodic structure, which mainly uses two coherent lights to overlap in space to produce periodic interference fringes. When a photosensitive material (such as a photoresist) is placed under the interference fringes, the interference fringes can be transferred to the photoresist layer to form a periodic grating structure, and then this grating structure is transferred to different materials by various etching techniques. Advantages of laser interference lithography technology are that it is low-cost and fast, and now widely used in the production of the grating structure definition of a single-wavelength distributed-feedback semiconductor laser for fiber-optic communication. The required grating periodicity is as low as 200 nanometers (nm), and the desired exposure area in wafer-level semiconductor lasers of III-V substrate is at least 2 inches. In addition, the laser interference lithography technology has potential applications including the production of a patterned sapphire substrate for high-efficiency light-emitting diodes, and the accomplishment of the wire grid polarizers, which has the common requirements toward a short-period and a large exposure area.

The most common laser interference lithography system uses Lloyd's mirror to achieve two-beam interference. This architecture comprises a mirror and a sample carrier which are arranged and fixed at right angles, and a coherent light is expanded to irradiate the mirror and the sample carrier at the same time, the light on the mirror will be reflected to the sample carrier to form two-beam interference. The advantages of this architecture are that it is simple and easy to set up, as well as that it has less impact from its surroundings, but its drawback is that it is unable to produce a large-area and uniform periodic structure. The main reason is that the two beams generated by this architecture are not evenly distributed, and they are respectively the left and right-half of a Gaussian distribution. When the two beams are overlapping in space, the sample close to the mirror is irradiated by the strong energy, and the sample away from the mirror is irradiated by the weak energy, thus a grating structure is not uniformly formed on the sample, and the uniform exposure area is generally less than 2 inches. In addition, the configuration of Lloyd's mirror interferometer is not suitable for forming long-period grating structures over a large sample area. For a grating period greater than 500 nm, this system allows less than 1 inch illumination coverage that limits its applications.

If wafer-scale production of periodic grating is desired, two independent light beams are generally used to perform the interference to improve the uniformity of the light field and to extend the achievable grating period in the Lloyd's mirror system. That is, a beam splitter is used for dividing a laser beam into two beams and then the two beams are respectively expanded, and finally two mirrors are respectively used to allow the two beams to form the interference fringes. This two-beam laser interference lithography allows the sample to be centered on the intensity maximum of Gaussian beam profile, and therefore to intercept uniform and higher illumination intensity. However, this approach lacks the simplicity for tuning the grating periodicity due to the fixed optical configuration such that this system requires laborious optical path reconfiguration for varying grating periods. Additionally, a large optical table is typically required to guarantee the necessary degrees of freedom for optical path realignment.

Referring to U.S. Pat. No. 8,681,315 published in 2011, W. Mao at al. disclosed a new type of two-beam interference lithography system with adjustable mirror planes, which has two additional mirrors to modify the travelling path of the two expanded beams, and further to freely adjust the period of the interference fringes without optical path reconfiguration. However, the system is still unfavorable to produce long-period grating that requires a small incident angle of laser beams for interference. The size of interference lithography system will be very large in order to place the sample at the interference position where two beams are overlapping. Due to the long distance between the sample and reflecting mirrors, the laser energy cannot be efficiently utilized and the exposure time will be tremendously increased.

It is therefore necessary to provide an interference lithography device, in order to solve the problems existing in the conventional technology as described above.

SUMMARY OF THE INVENTION

A primary object of the present invention is to provide an interference lithography device which has the advantages of a large exposure area and an adjustable period. The interference lithography device has a smaller area of the entire system, and has flexibility for adjusting the grating period (200 to 2000 nm) as well as the exposure area being over 4 inches. In addition, when the grating period is adjusted, the optical path does not need reconfiguration before the light beams are expanded but just to modify the respective angles of optical mirrors in the rear end of the system, that is very convenient for use, and the process and time spent on re-aligning the optical elements are saved.

To achieve the above objects, the present invention provides an interference lithography device, comprising a laser source providing a laser beam; a base having: a beam splitter disposed on the base and configured to divide the laser beam into a first beam portion and a second beam portion; a beam expander disposed on the base and in front of the beam splitter to respectively expand a diameter of the first beam portion and a diameter of the second beam portion; a first set of reflectors disposed on the base and between the beam splitter and the beam expander, and having a first reflector and a second reflector respectively reflecting the first beam portion and the second beam portion to the beam expander; and a second set of reflectors disposed on the base and in front of the beam expander, and having a third reflector and a fourth reflector respectively reflecting the first beam portion and the second beam portion; a set of lower reflectors disposed below the base, and including a fifth reflector, a sixth reflector and a first lateral rail, wherein the fifth reflector and the sixth reflector are laterally movably mounted on the first lateral rail respectively; and a sample carrying stage disposed below the base and in front of the set of lower reflectors for loading a substrate, wherein the sample carrying stage is laterally movably mounted on a second lateral rail which is longitudinally movably mounted on a longitudinal rail; wherein the first beam portion and the second beam portion are respectively reflected by the third reflector and the fourth reflector toward the set of lower reflectors, and then are respectively reflected by the fifth reflector and the sixth reflector so that the first beam portion and the second beam portion commonly form an interference pattern on the substrate.

In one embodiment of the present invention, the base has at least one polarization controller disposed between the first set of reflectors and the beam expander for adjusting the polarized direction of the first beam portion to be parallel to the polarized direction of the second beam portion during interference.

In one embodiment of the present invention, the polarization controller is a half-wave plate.

In one embodiment of the present invention, a distance between the fifth reflector and the sixth reflector is adjusted by moving the fifth reflector and the sixth reflector on the first lateral rail.

In one embodiment of the present invention, the second set of reflectors and the set of lower reflectors are all rotatable for adjusting the directions of the first beam portion and the second beam portion so that the first beam portion and the second beam portion propagate with a predetermined angle onto the substrate to form the interference pattern.

In one embodiment of the present invention, a distance between the third reflector and the fourth reflector is different from a distance between the fifth reflector and the sixth reflector.

In one embodiment of the present invention, a distance between the sample carrying stage and the set of lower reflectors is adjusted by moving the sample carrying stage and the second lateral rail on the longitudinal rail so that the substrate is placed within an overlapping area given by the first beam portion and the second beam portion.

In one embodiment of the present invention, the first beam portion and the second beam portion after passing the first set of reflectors are orientated to be parallel to each other, or to have a pretilt angle therebetween.

In one embodiment of the present invention, the sample carrying stage is rotatably adjusted so as to allow multiple exposures to the interference pattern for forming one-dimensional or two-dimensional periodic structures.

In one embodiment of the present invention, each reflector in the first set of reflectors has a mirror surface area smaller than that of each reflector in the second set of reflectors, while the mirror surface area of each reflector in the second set of reflectors is smaller than that of each reflector in the set of lower reflectors.

DETAILED DESCRIPTION OF THE PREFERRED EMBODIMENTS

The structure and the technical means adopted by the present invention to achieve the above and other objects can be best understood by referring to the following detailed description of the preferred embodiments. Furthermore, if there is no specific description in the invention, singular terms such as "a", "one", and "the" include the plural number. For example, "a compound" or "at least one compound" may include a plurality of compounds, and the mixtures thereof. If there is no specific description in the invention, "%" means "weight percentage (wt %)", and the numerical range (e.g. 10%~11% of A) contains the upper and lower limit (i.e. 10%≤A≤11%). If the lower limit is not defined in the range (e.g. less than, or below 0.2% of B), it means that the lower limit may be 0 (i.e. 0%≤B≤0.2%). The proportion of "weight percent" of each component can be replaced by the proportion of "weight portion" thereof. The abovementioned terms are used to describe and understand the present invention, but the present invention is not limited thereto.

Figure 1:
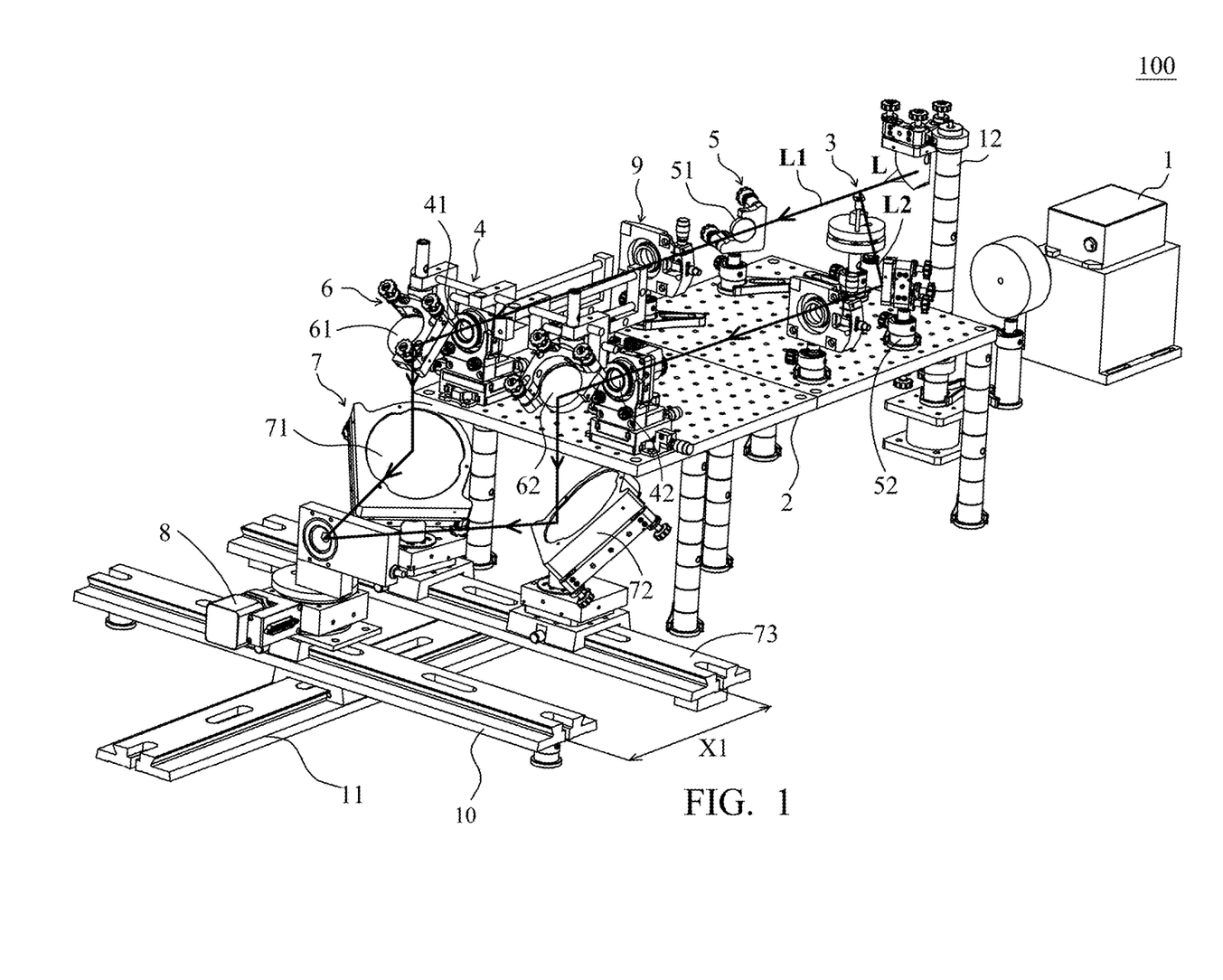
FIG. 1 is a schematic view of an interference lithography device according to one embodiment of the present invention.

Referring to FIG. 1, one embodiment of the present invention provides an interference lithography device 100, which mainly comprises a laser source 1; a base 2 having a beam splitter 3, a beam expander 4, a first set of reflectors 5, and a second set of reflectors 6; a set of lower reflectors 7; and a sample carrying stage 8 for loading a substrate (not shown). The interference lithography device 100 can form an interference pattern on the substrate. The terms "in front", "distal end", "far away", "behind", "proximal end", "near" and "close to" in the description hereinafter are based on the laser source as a reference point. On the light pathways of the same plane, the terms "in front" or "distal end" mean where is relatively far away from the laser source, and the terms "behind" or "proximal end" mean where is relatively near or close to the laser source relative to the other place. For example, the recitation "A element in front of B element" means that A element is farther away from the light source than B element, so that B element is located between A element and the light source.

As shown in FIG. 1, in one embodiment of the present invention, the laser source 1 is to provide a laser beam L having a wavelength of 325 nm, 355 nm, 365 nm, 405 nm, or other ultraviolet wavelength. Preferably, the laser source 1 can be a solid-state laser source (diode-pumped solid-state laser). The solid-state laser source has an optical power of up to 100 mW with a wavelength of 355 nm and coherent length over 40 m as well as a compact laser size of only 125×70×45 mm. The He—Cd gas laser generally applied to the interference lithography is also available to provide the laser beam L, which has an output of the optical power of 50 mW, but the coherent length is only 30 cm; the device is bulky and space occupied, and the laser has a shorter lifetime. In one embodiment of the present invention, a height of the laser beam position 1 can be adjusted or modified by using a beam steerer 12 which comprises two 45-degree-angled dielectric mirrors to move up and down along a vertical steel column so as to vertically shift the incident light beam to any height while maintain the polarization of the laser beam 1.

The base 2 is for example an optical stage which can be used for assembling and fixing the optical elements disposed thereon. The laser beam L can be divided into a first beam portion L1 and a second beam portion L2 after passing through the beam splitter 3. The beam splitter 3 is for example a cube beam splitter for dividing a laser beam into two sub-beams, and each sub-beam has half the energy Intensity of the original laser beam. The beam expander 4 comprises a first expander 41 and a second expander 42 disposed in front of the beam splitter 3. The first expander 41 and the second expander 42 are for example the spatial filters used for expanding the laser light field to enlarge the diameter of the first beam portion L1 and the second beam portion L2, and to remove the noise of the laser itself. The spatial filter generally includes a 40× UV objective and a pinhole.

The first set of reflectors 5 is disposed between the beam splitter 3 and the beam expander 4, and comprises a first reflector 51 and a second reflector 52, such as two pieces of 1 inch optical mirror, which are configured to reflect the first beam portion L1 and the second beam portion L2 in order to pass them respectively through the first expander 41 and the second expander 42.

The second set of reflectors 6 is disposed in front of the beam expander 4, and comprises a third reflector 61 and a fourth reflector 62, such as 2-inch optical mirrors, which is configured to respectively reflect the first beam portion L1 and the second beam portion L2 toward the underside of the base 2, and then the first beam portion L1 and the second beam portion L2 propagate toward the set of lower reflectors 7. Preferably, a distance between the third reflector 61 and the fourth reflector 62 is fixed constantly.

The set of lower reflectors 7 is disposed below the base 2, comprising a fifth reflector 71, a sixth reflector 72, and a first lateral rail 73. The fifth reflector 71 and the sixth reflector 72 are for example 4-inch optical mirrors and laterally movably mounted on the first lateral rail 73 respectively. Therefore, the distance between the fifth reflector 71 and the sixth reflector 72 can be adjusted at will. In addition, the relative position of the second set of reflectors 6 and the set of lower reflectors 7 is not specifically limited as long as the first beam portion L1 and the second beam portion L2 on the base 2 are reflected and propagated toward the set of lower reflectors 7.

The sample carrying stage 8 is disposed below the base 2 and in front of the set of lower reflectors 7, and laterally movably mounted on a second lateral rail 10. Preferably, the second lateral rail 10 can also be longitudinally movably mounted on a longitudinal rail. Therefore, a longitudinal distance X1 between the sample carrying stage 8 and the set of lower reflectors 7 and the laterally relative position can be adjusted freely, so that the illumination coverage and the periodicity of the interference fringe has more flexibility and variety.

As mentioned above, each of the first set of reflectors 5, the second set of reflectors 6, and the set of lower reflectors 7 can be mounted on a rotatable carriers for electrically or manually controlling three-dimensional rotation of each reflector. The sample carrying stage 8 can also be mounted on a rotatable carrier so that the interference pattern can be formed with the one-dimensional or two-dimensional periodic fringes. Generally, the substrate has a photo-sensitive material previously applied thereon, that is, the two-dimensional periodic fringes can be formed by two-step exposure, and before the second exposure, and the substrate is rotated to a predetermined angle by the sample carrying stage 8. The one-dimensional or two-dimensional periodic fringes have a periodicity ranged from 200 nm to 2000 nm, and the exposure area over 4 inches can be achieved.

Preferably, compared with the set of lower reflectors 7 and the sample carrying stage 8, the optical elements configured on the base 2 are relatively immobile. That is, the relative position of the optical elements does not change frequently, but it is not limited thereto. The relative position of the optical elements can be modified or tuned in response to different requirements.

In one embodiment of the present invention, the first beam portion L1 and the second beam portion L2 passing over the base 2 (upper path) are respectively directed by the second set of reflectors 6 and the set of lower reflectors 7 to a lower path below the base 2 in order to carry out the interference. A distance P between the third reflector 61 and the fourth reflector 62 is fixed herein. In practical operation, the distance P is substantially 8 to 25 cm. Since the fifth reflector 71 and the sixth reflector 72 is mounted on the first lateral rail 73, the distance S (not shown) therebetween can be adjusted freely. According to a targeted interference period, the distance S will determine the interference position, that is, a longitudinal distance X1 between the sample carrying stage 8 and the set of lower reflectors 7. Thus, when the distance P (not shown) of the second set of reflectors 6 is not equal to the distance S of the set of lower reflectors 7, the rotating angles of the second set of reflectors 6 and the set of lower reflectors 7 should be modified to direct the first beam portion L1 and the second beam portion L2 from the upper path toward the lower path for performing interference process.

Figure 2A:
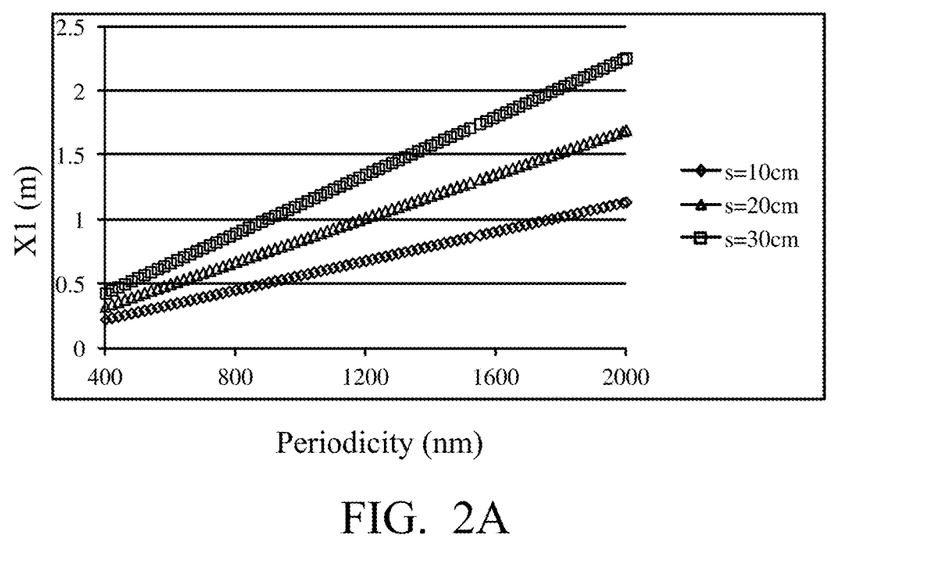
FIG. 2A shows the changes of the longitudinal distance X1 with the grating periodicity in the case of a fixed distance S of the set of lower reflectors.
Figure 2B:
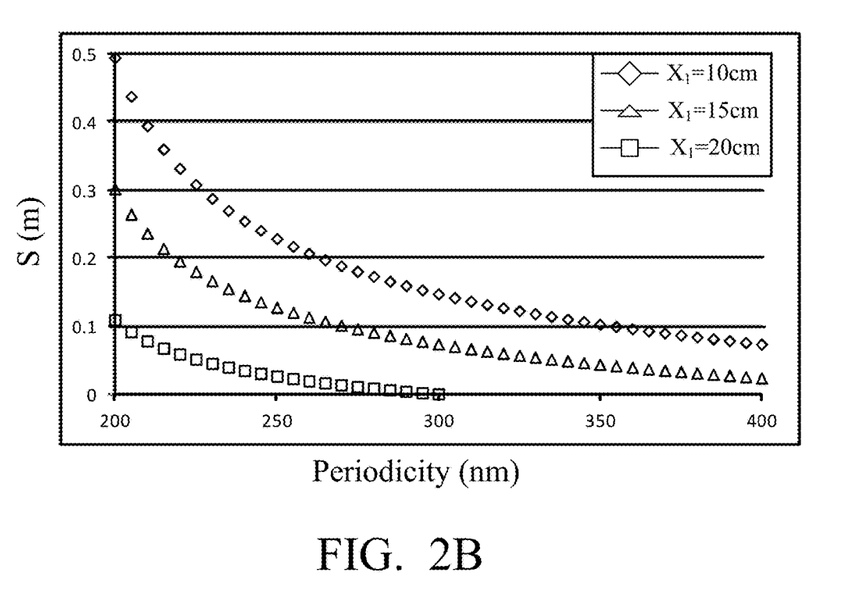
FIG. 2B shows that the longitudinal distance X1 is fixed at a specific position by changing the distance S of the set of lower reflectors, so that the longitudinal distance X1 is not affected by the grating periodicity.

In one embodiment of the present invention, when the distance S is a constant, the interference position X1 is increased when the grating period is increased, as shown in FIG. 2A. When the required grating period is greater than 1 micron, the overlapping interference position X1 of the two laser beams is greater than 1 meter, and thus lead to a weak light intensity for two expanded light beams. In addition, a larger X1 will make the overall system not compact. Therefore, when fabricating a long-period grating, the distance S of the set of lower reflectors 7 according to the present invention can be reduced to allow the interference position X1 to be fixed at a specific position and not affected by the variation of the grating period. Accordingly, the overall system remains compact for a wide range of grating period. In practical operation, when forming long-period gratings, the distance S can be reduced to 8 cm, but it is not limited thereto. On the contrary, when forming the short-period gratings (e.g. 200 nm), the overlapping interference position X1 will be less than 10 cm. Meanwhile, because the transmitting distance of the two expanded light beams are too short, and the energy of the two expanded light beams still maintains the Gaussian distribution, the energy distribution is not uniform when performing the interference, so that the grating having large area and uniform structure still cannot be formed. Therefore, as shown in FIG. 2B, when forming the short-period gratings, the distance S can be modified to fix the interference position X1 which is not affected by the variation of the grating period. In practical operation, when forming short-period gratings, the distance S can be increased to 25 cm. It should be understood that the interference lithography device 100 in the present invention can form the interference pattern uniformly over a large area by simply modifying the angle or distance of the set of lower reflectors 7, wherein the area occupied by the overall system remains constant, in response to the variation of the period.

Figure 3A:
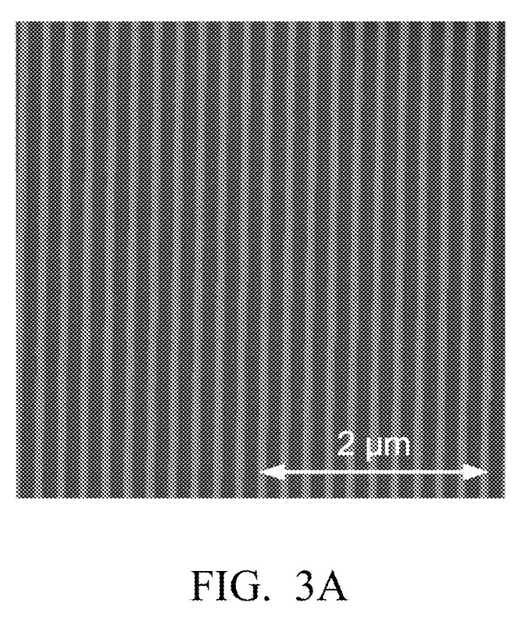
FIGS. 3A to 3E are SEM photos for showing the one-dimensional and two-dimensional periodic fringes formed on the photoresist by the interference lithography device according to one embodiment of the present invention, wherein the periodicity of FIGS. 3A, 3B, 3C, 3D, and 3E are 200 nm, 400 nm, 800 nm, 350 nm, and 800 nm, respectively.
Figure 3B:
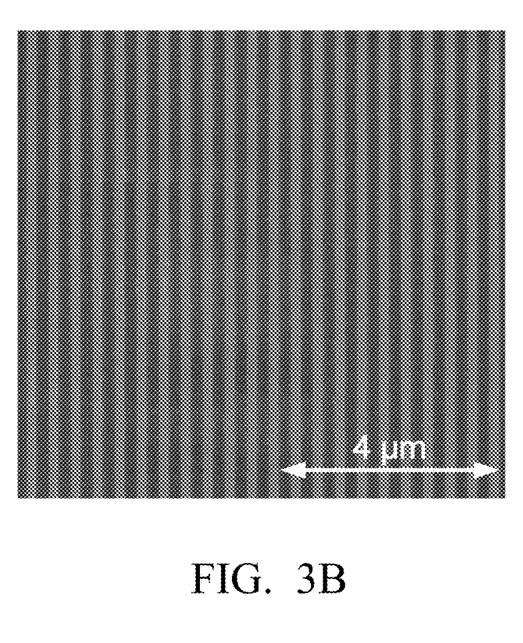
Figure 3C:
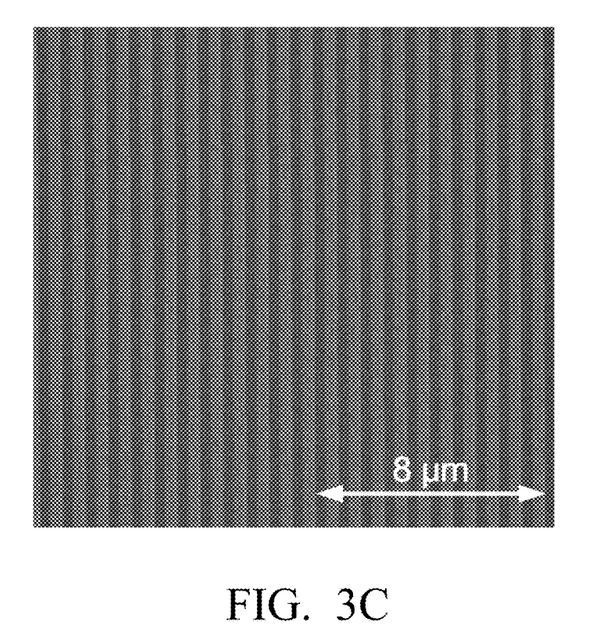
Figure 3D:
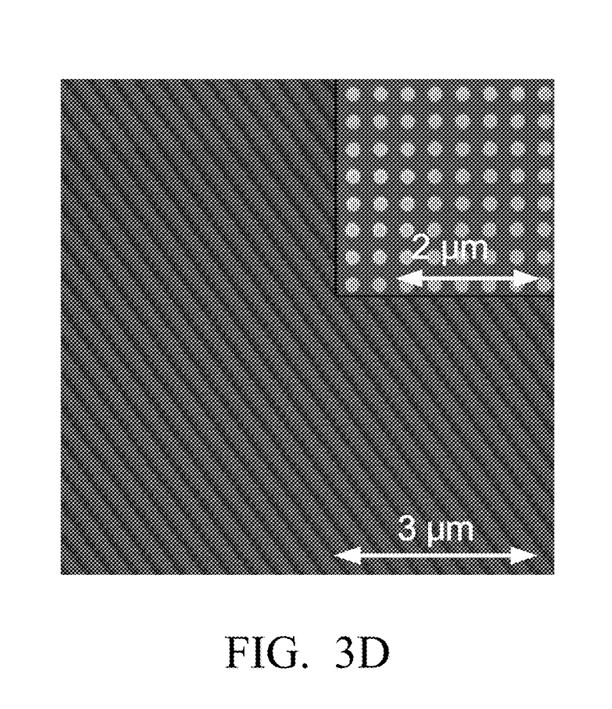
Figure 3E:
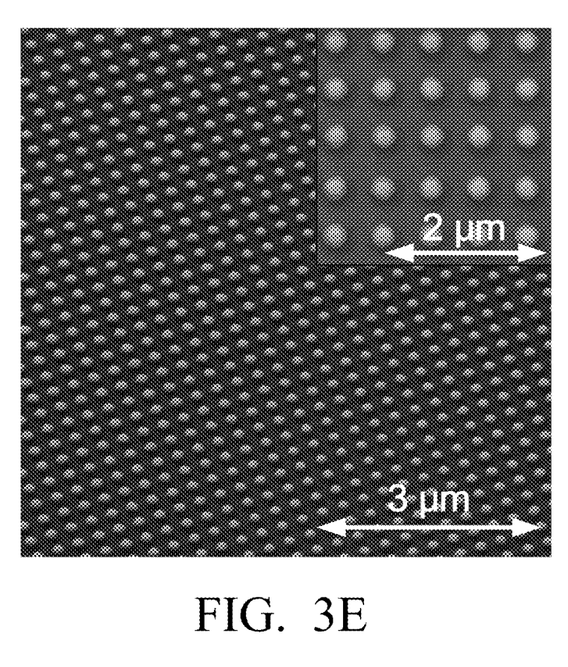

As shown in FIGS. 3A to 3E, the interference lithography device 100 can form uniform one-dimension or two-dimension interference pattern on the substrate, wherein FIGS. 3A to 3C show the one-dimensional periodic fringes, and FIGS. 3D to 3E show the two-dimensional periodic fringes. The two-dimensional periodic fringes can be formed by two-step exposure, and before the second exposure, the substrate is rotated to a predetermined angle. From FIGS. 3A to 3E, the interference lithography device according to the present invention can successfully produce periodic structures with periodicity ranging from 200 nm to 800 nm.

Figure 4:
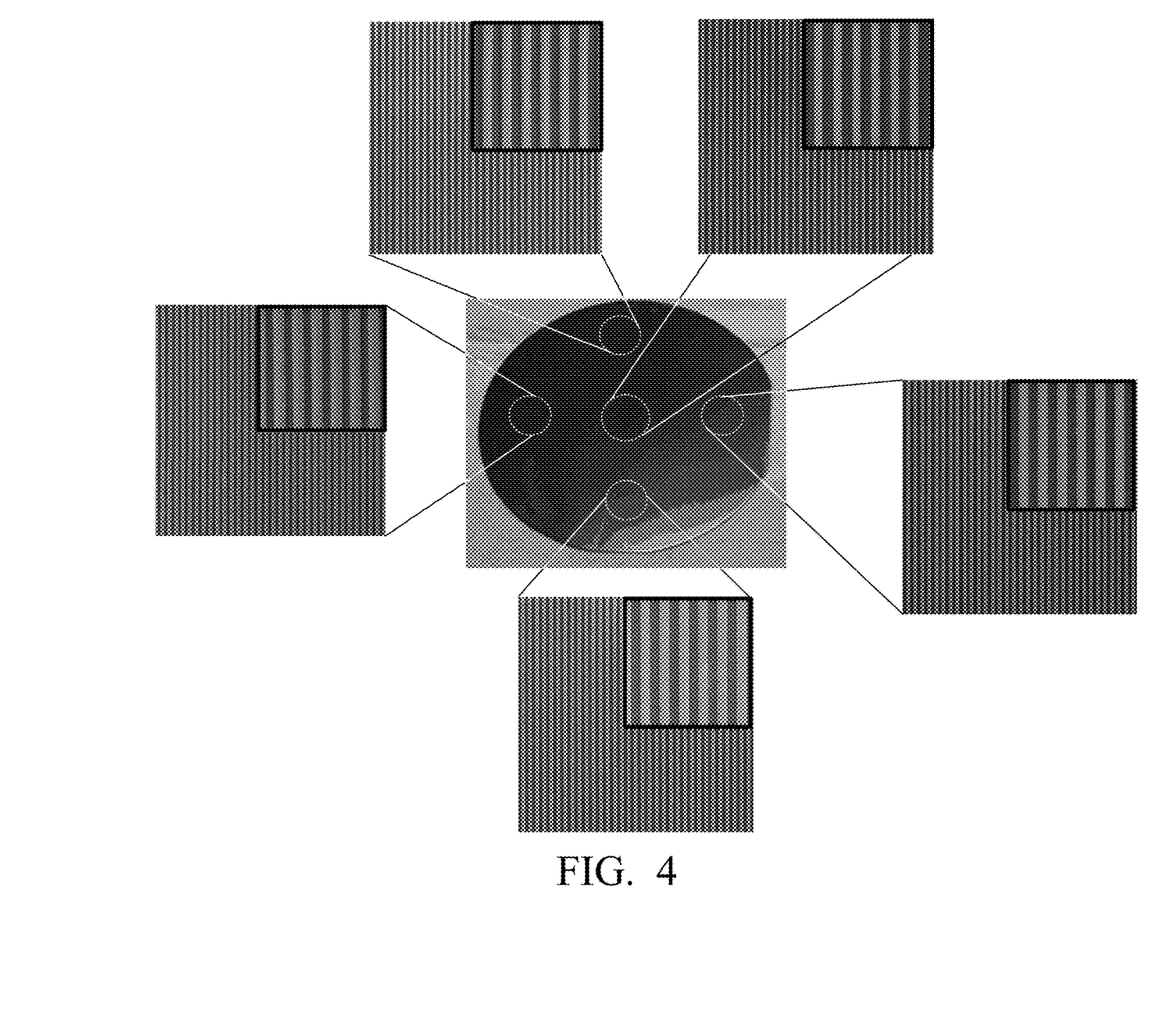
FIG. 4 is SEM photos of 4 inches silicon substrate after forming the periodic pattern by the interference lithography device according to one embodiment of the present invention.

To verify the uniformity of the grating structure formed on a silicon substrate by the interference lithography device according to the present invention, as shown in FIG. 4. The up, down, left, right, and central portions of a silicon substrate having the grating structure are characterized by using a scanning electron microscope (SEM), and each portion of the silicon substrate has superior grating uniformity.

In one embodiment of the present invention, if the short-period grating is desired, in addition to increase the distance S of the set of lower reflectors 7, the set of lower reflectors 7 can also be adjusted to allow the first beam portion L1 and the second beam portion L2 to have larger reflecting angles. That is, the set of lower reflectors 7 can be rotated with a larger angle. However, the Gaussian distribution of the expanded light is seriously distorted as the interference angle increases, which is unfavorable for forming interference pattern over a large area. Therefore, according to one embodiment of the present invention, the angle of the first set of reflectors 5 can be adjusted, so that the first beam portion L1 and the second beam portion L2 have a pre-tilt angle after being reflected, that is, they are not parallel. For example, when the desired period of the grating is 200 nm, the interference angle is about 62.5 degrees, and thus the first set of reflectors 5 can be adjusted previously to direct the first beam portion L1 and the second beam portion L2 to have such a pre-determined angle before being reflected by the second set of reflectors 6 and the set of lower reflectors 7. In this case, the set of lower reflectors 7 does not require a large angular displacement for forming short-period gratings and the circular Gaussian distribution of the light beams can be preserved.

In one embodiment of the present invention, the laser source 1 can provide a laser beam L with a linear polarization. The polarization is perpendicular to the light incident plane. After passing through the beam steerer 12, the beam splitter 3, the first set of reflectors 5, and the beam expander 4, the light beams preserve its original polarization direction. However, when the first beam portion L1 and the second beam portion L2 reach the second set of reflectors 6 and the set of lower reflectors 7, the linear polarization direction will change with the angle of the optical mirror but still maintain the property of the linear polarization. The shift of the polarization direction can be compensated by a polarization controller 9 disposed between the first set of reflectors 5 and the beam expander 4. Preferably, the polarization controller 9 can be a half-wave plate with the main function of adjusting the linear polarization direction of the laser beams. Through controlling the rotating angle of the half-wave plate, the first beam portion L1 and the second beam portion L2 can maintain its polarization direction (perpendicular to the light incident plane) for forming interference fringes with high visibility.

Compared with the current technology, the interference lithography device of the present invention is capable of flexibly adjusting the period of the interference fringes formed by two beams and the overlapping position of the two beams without optical path reconfiguration. In addition, compared with the current backward-propagating two-beam interference lithography system, the present invention is to provide a forward-propagating interference lithography system, which a flexible system configuration can be implemented for long-period and short-period grating formation without scarifying the illumination coverage, the grating uniformity, and the system compactness. The potential applications include the production of Bragg grating reflectors for semiconductor single-wavelength distributed-feedback lasers, patterned sapphire substrates for light-emitting diodes, and antireflective surfaces for solar cells.

The present invention has been described with preferred embodiments thereof and it is understood that many changes and modifications to the described embodiments can be carried out without departing from the scope and the spirit of the invention that is intended to be limited only by the appended claims.

What is claimed is:

1. An interference lithography device, comprising:
   a laser source providing a laser beam;
   a base having:
      a beam splitter disposed on the base and configured to divide the laser beam into a first beam portion and a second beam portion;
      a beam expander disposed on the base and in front of the beam splitter to respectively expand a diameter of the first beam portion and a diameter of the second beam portion;
      a first set of reflectors disposed on the base and between the beam splitter and the beam expander, and having a first reflector and a second reflector respectively reflecting the first beam portion and the second beam portion to enter the beam expander; and
      a second set of reflectors disposed on the base and in front of the beam expander, and having a third reflector and a fourth reflector respectively reflecting the first beam portion and the second beam portion;
   a set of lower reflectors disposed below the base, and including a fifth reflector, a sixth reflector and a first lateral rail, wherein the fifth reflector and the sixth reflector are laterally movably mounted on the first lateral rail respectively; and
   a sample carrying stage disposed below the base and in front of the set of lower reflectors for loading a substrate, wherein the sample carrying stage is laterally movably mounted on a second lateral rail which is longitudinally movably mounted on a longitudinal rail;
   wherein the first beam portion and the second beam portion are respectively reflected by the third reflector and the fourth reflector toward the set of lower reflectors, and then are respectively reflected by the fifth reflector and the sixth reflector so that the first beam portion and the second beam portion commonly form an interference pattern on the substrate.

2. The interference lithography device according to claim 1, wherein the base has at least one polarization controller disposed between the first set of reflectors and the beam expander for adjusting the polarized direction of the first beam portion to be parallel to the polarized direction of the second beam portion during interference.

3. The interference lithography device according to claim 2, wherein the polarization controller is a half-wave plate.

4. The interference lithography device according to claim 1, wherein a distance between the fifth reflector and the sixth reflector is adjusted by moving the fifth reflector and the sixth reflector on the first lateral rail.

5. The interference lithography device according to claim 1, wherein the second set of reflectors and the set of lower reflectors are all rotatable for adjusting the directions of the first beam portion and the second beam portion so that the first beam portion and the second beam portion propagate with a pre-determined angle onto the substrate to form the interference pattern.

6. The interference lithography device according to claim 1, wherein a distance between the third reflector and the fourth reflector is different from a distance between the fifth reflector and the sixth reflector.

7. The interference lithography device according to claim 1, wherein a distance between the sample carrying stage and the set of lower reflectors is adjusted by moving the sample carrying stage and the second lateral rail on the longitudinal rail so that the substrate is placed within an overlapping area given by the first beam portion and the second beam portion.

8. The interference lithography device according to claim 1, wherein the first beam portion and the second beam portion after passing the first set of reflectors are orientated to be parallel to each other, or to have a pretilt angle therebetween.

9. The interference lithography device according to claim 1, wherein the sample carrying stage is rotatably adjusted so as to form the interference pattern with one-dimensional periodic fringes or two-dimensional periodic fringes.

10. The interference lithography device according to claim 1, wherein each reflector in the first set of reflectors has a mirror surface area smaller than that of each reflector in the second set of reflectors, and the mirror surface area of each reflector in the second set of reflectors is smaller than that of each reflector in the set of lower reflectors.

* * * * *

UNITED STATES PATENT AND TRADEMARK OFFICE
CERTIFICATE OF CORRECTION

Page 1 of 1

PATENT NO. : 9,904,176 B2
APPLICATION NO. : 15/145816
DATED : February 27, 2018
INVENTOR(S) : Hung et al.

It is certified that error appears in the above-identified patent and that said Letters Patent is hereby corrected as shown below:

On the Title Page

Item [73], delete "NATIONAL SUN YAT-SEN UNVIERSITY" and insert -- NATIONAL SUN YAT-SEN UNIVERSITY --

Signed and Sealed this
Tenth Day of April, 2018

Andrei Iancu
*Director of the United States Patent and Trademark Office*